United States Patent
Toda

Patent Number: 6,072,263
Date of Patent: Jun. 6, 2000

[54] SURFACE ACOUSTIC WAVE TRANSDUCING DEVICE

[76] Inventor: Kohji Toda, 1-49-18 Futaba, Yokosuka 239, Japan

[21] Appl. No.: 08/694,984

[22] Filed: Aug. 9, 1996

[51] Int. Cl.[7] .................................................. H01L 41/08
[52] U.S. Cl. .................................. 310/313 B; 310/313 R
[58] Field of Search ........................... 310/313 A, 313 B, 310/313 R; 333/150–155, 193–196

[56] References Cited

U.S. PATENT DOCUMENTS 5,160,869  11/1992  Nakahata et al. ..................... 310/313 A
5,329,208  7/1994  Imai et al. ........................... 310/313 R

*Primary Examiner*—Marr O. Budd

[57] ABSTRACT

A surface acoustic wave position-sensing device comprising a piezoelectric substrate, a nonpiezoelectric plate and an interdigital transducer formed on one end surface of the piezoelectric substrate. The piezoelectric substrate is mounted on an upper end surface of the nonpiezoelectric plate through the interdigital transducer. When using the surface acoustic wave transducing device as an input device, an electric signal is applied to the interdigital transducer. In this time, a surface acoustic wave is excited in the piezoelectric substrate, and then transmitted to the upper end surface of the nonpiezoelectric plate. When using the surface acoustic wave transducing device as an output device, a surface acoustic wave transmitted from the upper end surface of the nonpiezoelectric plate to the piezoelectric substrate is transduced to an electric signal at the interdigital transducer.

5 Claims, 8 Drawing Sheets

SURFACE ACOUSTIC WAVE TRANSDUCING DEVICE

BACKGROUND OF THE INVENTION

1. Field of the Invention

The present invention relates to a surface acoustic wave device for transducing an electric signal to a surface acoustic wave on a nonpiezoelectric plate having a piezoelectric substrate with at least an interdigital transducer.

2. Description of the Prior Art

Conventional methods for exciting an acoustic vibration on a nonpiezoelectric plate generally include a wedge-shaped transducer with a bulk wave vibrator for vibrating a nonpiezoelectric plate indirectly, or a piezoelectric thin film transducer for vibrating a nonpiezoelectric plate directly. The wedge-shaped transducer is mainly used for a non-destruction evaluation by ultrasound under a comparative low frequency operation alone because of the difficulty on manufacturing accuracy of the wedge angle and so on. The piezoelectric thin film transducer consists of a nonpiezoelectric plate, a piezoelectric thin film mounted on the nonpiezoelectric plate and made from ZnO and others, and interdigital transducers exciting the acoustic vibration on the nonpiezoelectric plate. Because of various transmission characteristics of the interdigital transducers with various structures, the piezoelectric thin film transducer is used as a high frequency device, however has operation frequencies limited to the UHF and VHF bands, and has some problems on manufacturing and mass production.

Thus, there are some problems on response time, sensitivity, durability, manufacturing, mass production, difficulty in use, operation frequencies, and high voltage operation with high power consumption in conventional transducers.

SUMMARY OF THE INVENTION

An object of the present invention is to provide a surface acoustic wave transducing device capable of exciting a surface acoustic wave in a nonpiezoelectric plate under low power consumption with low voltage.

Another object of the present invention is to provide a surface acoustic wave transducing device capable of transducing a surface acoustic wave in a nonpiezoelectric plate to an electric signal with a quick response time.

Another object of the present invention is to provide a surface acoustic wave transducing device being easy to support a nonpiezoelectric plate having a piezoelectric substrate thereon.

A still other object of the present invention is to provide a surface acoustic wave transducing device excellent in durability, manufacturing and mass-production.

A still further object of the present invention is to provide a surface acoustic wave transducing device with a small size which is very light in weight and has a simple structure.

According to one aspect of the present invention there is provided a surface acoustic wave transducing device comprising a piezoelectric substrate, a nonpiezoelectric plate and an interdigital transducer formed on one end surface of the piezoelectric substrate. The piezoelectric substrate is mounted on an upper end surface of the nonpiezoelectric plate. The thickness d of the piezoelectric substrate is smaller than an interdigital periodicity p of the interdigital transducer. The thickness of the nonpiezoelectric plate is larger than three times the interdigital periodicity p.

When operating the surface acoustic wave transducing device as an input device, the interdigital transducer receives an electric signal with a frequency approximately corresponding to the interdigital periodicity p, and excites a surface acoustic wave of the first mode and the higher order modes in the piezoelectric substrate. The surface acoustic wave having the wavelength approximately equal to the interdigital periodicity p is transmitted to the upper end surface of the nonpiezoelectric plate. In this time, the phase velocity of the surface acoustic wave of the first mode and the higher order modes is approximately equal to the phase velocity of the Rayleigh wave traveling on the nonpiezoelectric plate alone.

When operating the surface acoustic wave transducing device as an output device, the interdigital transducer transduces a surface acoustic wave, of the first mode and the higher order modes, transmitted from the upper end surface of the nonpiezoelectric plate to the piezoelectric substrate, to an electric signal with a frequency approximately corresponding to the interdigital periodicity p. In this time, the surface acoustic wave has the wavelength approximately equal to the interdigital periodicity p. The phase velocity of the surface acoustic wave is approximately equal to the phase velocity of the Rayleigh wave traveling on the nonpiezoelectric plate alone.

The nonpiezoelectric plate is made of a material such that the phase velocity of the surface acoustic wave traveling on the nonpiezoelectric plate alone is higher than that traveling on the piezoelectric substrate alone.

According to another aspect of the present invention there is provided a supporting board cemented to a lower end surface of the nonpiezoelectric plate.

According to other aspect of the present invention there is provided a piezoelectric substrate made of a piezoelectric ceramic, the polarization axis thereof being parallel to the thickness direction thereof.

According to another aspect of the present invention there is provided a piezoelectric substrate made of a piezoelectric polymer such as PVDF and so on.

According to a further aspect of the present invention there is provided a surface acoustic wave transducing device comprising a piezoelectric substrate, an interdigital transducer and an earth electrode formed on two end surfaces of the piezoelectric substrate, a phase shifter including at least a coil $L_1$, and a nonpiezoelectric plate. The interdigital transducer consists of two electrodes $I_1$, and $I_2$, and has two kinds of distances between one electrode finger of the electrode $I_1$, and two neighboring electrode fingers of the electrode $I_2$. Input terminals of the electrodes $I_1$, and $I_2$ are connected to the phase shifter in parallel. The piezoelectric substrate is mounted on an upper end surface of the nonpiezoelectric plate through the earth electrode.

When operating the surface acoustic wave transducing device as an input device, the interdigital transducer and the earth electrode receive an electric signal $E_1$ between the electrode $I_1$ and the earth electrode, and an electric signal $E_2$ between the electrode $I_2$ and the earth electrode via the phase shifter, and excite a surface acoustic wave of the first mode and the higher order modes in the piezoelectric substrate. The surface acoustic wave is transmitted to the upper end surface of the nonpiezoelectric plate. The phase difference between the electric signals $E_1$ and $E_2$ is $2\pi y$. In this time, $x < \frac{1}{2}$ in a shorter distance xp of the two kinds of distances between one electrode finger of the electrode $I_1$, and two neighboring electrode fingers of the electrode $I_2$, and $x+y= \pm\frac{1}{2}$ in the phase difference $2\pi y$ between the electric signals $E_1$ and $E_2$.

BRIEF DESCRIPTION OF THE DRAWINGS

Other features and advantages of the invention will be clarified from the following description with reference to the attached drawings.

DETAILED DESCRIPTION OF THE PRESENTLY PREFERRED EXEMPLARY EMBODIMENTS

Figure 1:
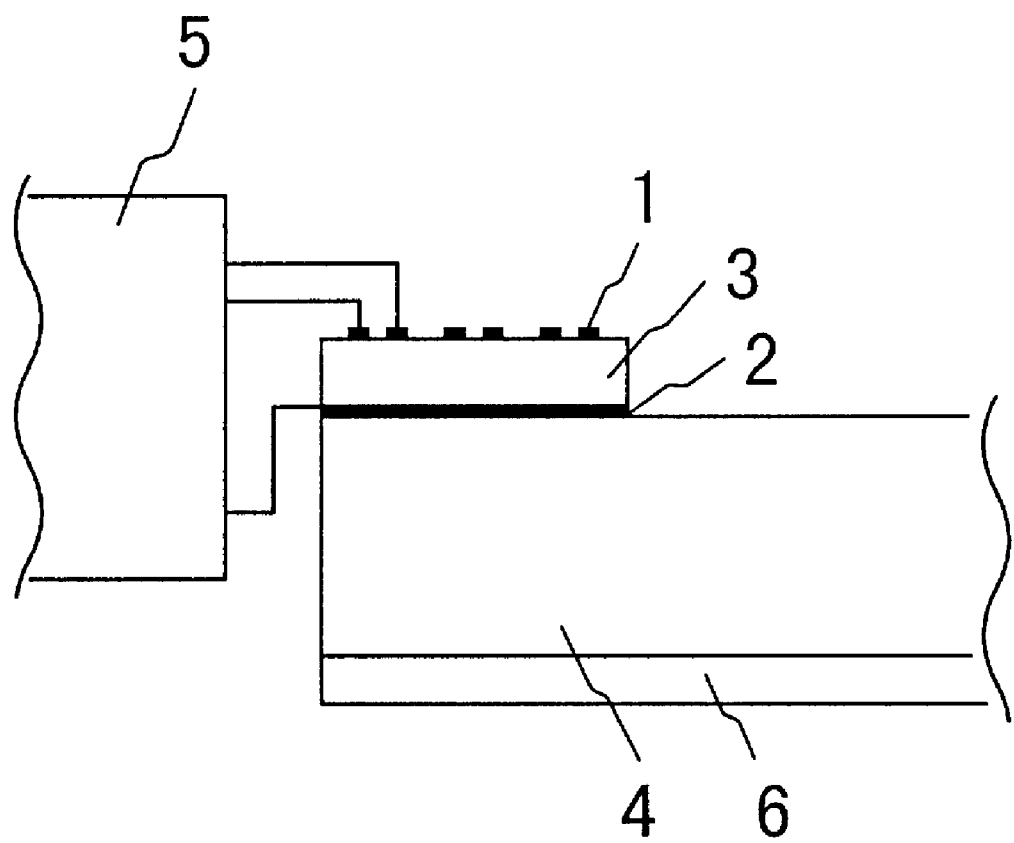
FIG. 1 shows a sectional view of a surface acoustic wave transducing device according to a first embodiment of the present invention.

FIG. 1 shows a sectional view of a surface acoustic wave transducing device according to a first embodiment of the present invention. The surface acoustic wave transducing device comprises interdigital transducer 1, earth electrode 2, piezoelectric substrate 3 having an upper- and a lower end surfaces running perpendicular to the thickness direction thereof, nonpiezoelectric plate 4 having an upper- and a lower end surfaces running perpendicular to the thickness direction thereof, phase shifter 5 and supporting board 6. Interdigital transducer 1, made from aluminium thin film, is mounted on an upper end surface of piezoelectric substrate 3. Earth electrode 2, made from aluminium thin film, is mounted on a lower end surface of piezoelectric substrate 3. Piezoelectric substrate 3, of which material is TDK-101A (Brand name), has a dimension of 150 $\mu$m in thickness and is cemented on an upper end surface of nonpiezoelectric plate 4 through an epoxy resin with thickness of about 20 $\mu$m. Nonpiezoelectric plate 4, made from a glass, has a dimension of 1.5 mm in thickness. A lower end surface of nonpiezoelectric plate 4 is cemented on supporting board 6.

Figure 2:
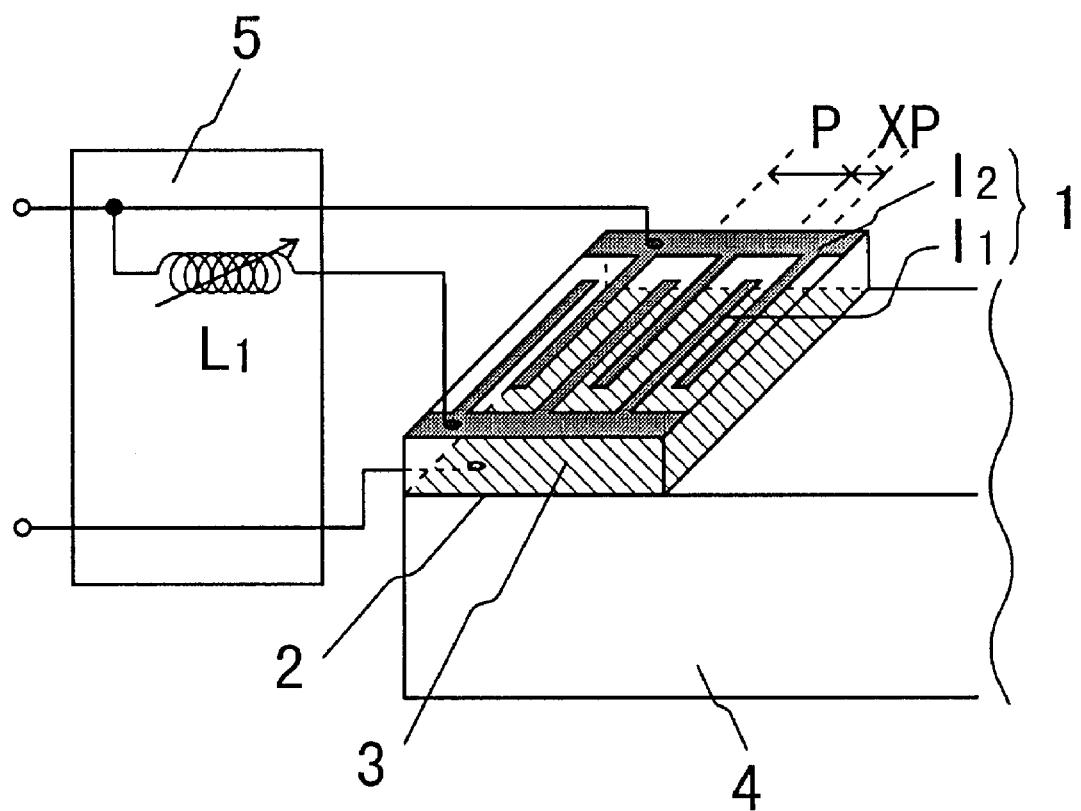
FIG. 2 shows a perspective view of the surface acoustic wave transducing device in FIG. 1.

FIG. 2 shows a perspective view of the surface acoustic wave transducing device in FIG. 1. Supporting board 6 is not drawn in FIG. 3. Interdigital transducer 1, comprising two electrodes $I_1$ and $I_2$, has a regular-type construction consisting of ten finger pairs with an interdigital periodicity p of 460 $\mu$m. Interdigital transducer 1 has two kinds of distances between one electrode finger and two neighboring electrode fingers, the shorter distance xp being 115 $\mu$m. Interdigital transducer 1 and earth electrode 2 are connected with phase shifter 5 including a coil $L_1$.

When operating the surface acoustic wave transducing device as an input device, an electric signal E having a frequency approximately corresponding to the interdigital periodicity p of interdigital transducer 1 is divided into two electric signals $E_1$ and $E_2$, with the phase difference 2 $\pi$y, by phase shifter 5, and then, the electric signals $E_1$ and $E_2$ are applied between electrode $I_1$, and earth electrode 2, and between electrode $I_2$ and earth electrode 2, respectively. In this time, if x<½ in the shorter distance xp in FIG. 2, and moreover, x+y=±½ in the phase difference 2 $\pi$y between the electric signals $E_1$ and $E_2$, the unidirectional surface acoustic wave, of the first mode and the higher order modes having the wavelength approximately equal to the interdigital periodicity p, is excited in piezoelectric substrate 3. For example, if x=¼, y=¼ or y=−¾. Thus, when xp=115 $\mu$m as shown in FIG. 2, and moreover, 2 $\pi$y=$\pi$/2(90°) or 2 $\pi$y=−3$\pi$/2(−270°), the unidirectional surface acoustic wave is excited in piezoelectric substrate 3. The excitation of the unidirectional surface acoustic wave generates no reflection of a surface acoustic wave at the side surface of piezoelectric substrate 3, so that seldom or never makes a noise. In addition, the excitation of the unidirectional elastic wave reduces a waste of an electric energy applied to interdigital transducer 1, causing the surface acoustic wave transducing device in FIG. 1 to be operated under low power consumption with low voltage.

The unidirectional surface acoustic wave excited in piezoelectric substrate 3 is transmitted to the upper end surface of nonpiezoelectric plate 4. Thus, the surface acoustic wave transducing device in FIG. 1 has a small size which is very light in weight and has a simple structure.

If the phase velocity of the unidirectional surface acoustic wave of the first mode and the higher order modes is approximately equal to the phase velocity of the Rayleigh wave traveling on nonpiezoelectric plate 4, the transducing efficiency from the electric signal E to the unidirectional surface acoustic wave increases, and in addition, the reflection caused by the miss-matching on the acoustic impedance at the boundary surface between piezoelectric substrate 3 and nonpiezoelectric plate 4 hardly ever causes.

If the thickness d of piezoelectric substrate 3 is smaller than the interdigital periodicity p of interdigital transducer 1, and the thickness of nonpiezoelectric plate 4 is larger than three times the interdigital periodicity p, the unidirectional surface acoustic wave excited in piezoelectric substrate 3 is transmitted to the upper end surface of nonpiezoelectric plate 4 effectively without a leakage of the unidirectional surface acoustic wave on the inside of nonpiezoelectric plate 4.

If using a material, as nonpiezoelectric plate 4, such that the phase velocity of the unidirectional surface acoustic wave traveling on nonpiezoelectric plate 4 alone is higher than that traveling on piezoelectric substrate 3 alone, the unidirectional surface acoustic wave excited in piezoelectric substrate 3 is transmitted to the upper end surface of nonpiezoelectric plate 4 effectively without a leakage of the unidirectional surface acoustic wave on the inside of nonpiezoelectric plate 4. Accordingly, it is possible to operate the surface acoustic wave transducing device in FIG. 1 under low power consumption with low voltage, and to support the lower end surface of nonpiezoelectric plate 4 directly.

If using a piezoelectric ceramic having the polarization axis parallel to the thickness direction thereof, as piezoelectric substrate 3, the unidirectional surface acoustic wave of the first mode and the higher order modes is excited in piezoelectric substrate 3 effectively, and the transducing efficiency from the electric signal E to the unidirectional surface acoustic wave increases.

If using a piezoelectric polymer such as PVDF and so on, as piezoelectric substrate 3, the unidirectional surface acoustic wave of the first mode and the higher order modes is excited in piezoelectric substrate 3 effectively, and the transducing efficiency from the electric signal E to the unidirectional surface acoustic wave increases.

When operating the surface acoustic wave transducing device as an output device, an unidirectional surface acoustic wave, of the first mode and the higher order modes, transmitted from the upper end surface of nonpiezoelectric plate 4 to piezoelectric substrate 3, is transduced to an electric signal $E_1$ between electrode $I_1$ and earth electrode 2, and an electric signal $E_2$ between electrode $I_2$ and earth electrode 2. In this time, x<½ in the shorter distance xp in FIG. 2, and moreover, x+y=±½ in the phase difference $2\pi y$ between the electric signals $E_1$ and $E_2$. For example, x=¼, y=¼ or y=-¾. Thus, when xp=115 $\mu$m as shown in FIG. 2, the electric signals $E_1$ and $E_2$, where $2\pi y=\pi/2(90°)$ or $2\pi y=-3\pi/2(-270°)$, are delivered between electrode $I_1$, and earth electrode 2, and between electrode $I_2$ and earth electrode 2, respectively. Each of the electric signals $E_1$ and $E_2$ has a frequency approximately corresponding to the interdigital periodicity p of interdigital transducer 1, the unidirectional surface acoustic wave having the wavelength approximately equal to the interdigital periodicity p. The electric signals $E_1$ and $E_2$ are combined and detected as an electric signal E at phase shifter 5. Thus, the surface acoustic wave transducing device as an output device has an ability to transduce only an unidirectional surface acoustic wave to an electric signal.

If the phase velocity of the unidirectional surface acoustic wave of the first mode and the higher order modes is approximately equal to the phase velocity of the Rayleigh wave traveling on nonpiezoelectric plate 4, the transducing efficiency from the unidirectional surface acoustic wave to the electric signals $E_1$ and $E_2$ increases, and the electric signal E is detected at phase shifter 5 with a quick response time. In addition, the reflection caused by the miss-matching on the acoustic impedance at the boundary surface between piezoelectric substrate 3 and nonpiezoelectric plate 4 hardly ever causes.

If the thickness d of piezoelectric substrate 3 is smaller than the interdigital periodicity p of interdigital transducer 1, and the thickness of nonpiezoelectric plate 4 is larger than three times the interdigital periodicity p, the unidirectional surface acoustic wave on the upper end surface of nonpiezoelectric plate 4 is transmitted to piezoelectric substrate 3 effectively without a leakage of the unidirectional surface acoustic wave on the inside of nonpiezoelectric plate 4. Accordingly, it is possible to operate the surface acoustic wave transducing device in FIG. 1 under low power consumption with low voltage, in addition, it is possible to support the lower end surface of nonpiezoelectric plate 4 directly.

If using a material, as nonpiezoelectric plate 4, such that the phase velocity of the unidirectional surface acoustic wave traveling on nonpiezoelectric plate 4 alone is higher than that traveling on piezoelectric substrate 3 alone, the unidirectional surface acoustic wave on the upper end surface of nonpiezoelectric plate 4 is transmitted to piezoelectric substrate 3 effectively without a leakage of the unidirectional surface acoustic wave on the inside of nonpiezoelectric plate 4.

If using a piezoelectric ceramic having the polarization axis parallel to the thickness direction thereof, as piezoelectric substrate 3, the unidirectional surface acoustic wave on the upper end surface of nonpiezoelectric plate 4 is transmitted to piezoelectric substrate 3 effectively, and the transducing efficiency from the unidirectional surface acoustic wave to the electric signals $E_1$ and $E_2$ increases.

If using a piezoelectric polymer such as PVDF and so on, as piezoelectric substrate 3, the unidirectional surface acoustic wave on the upper end surface of nonpiezoelectric plate 4 is transmitted to piezoelectric substrate 3 effectively, and the transducing efficiency from the unidirectional surface acoustic wave to the electric signals $E_1$ and $E_2$ increases.

Figure 3:
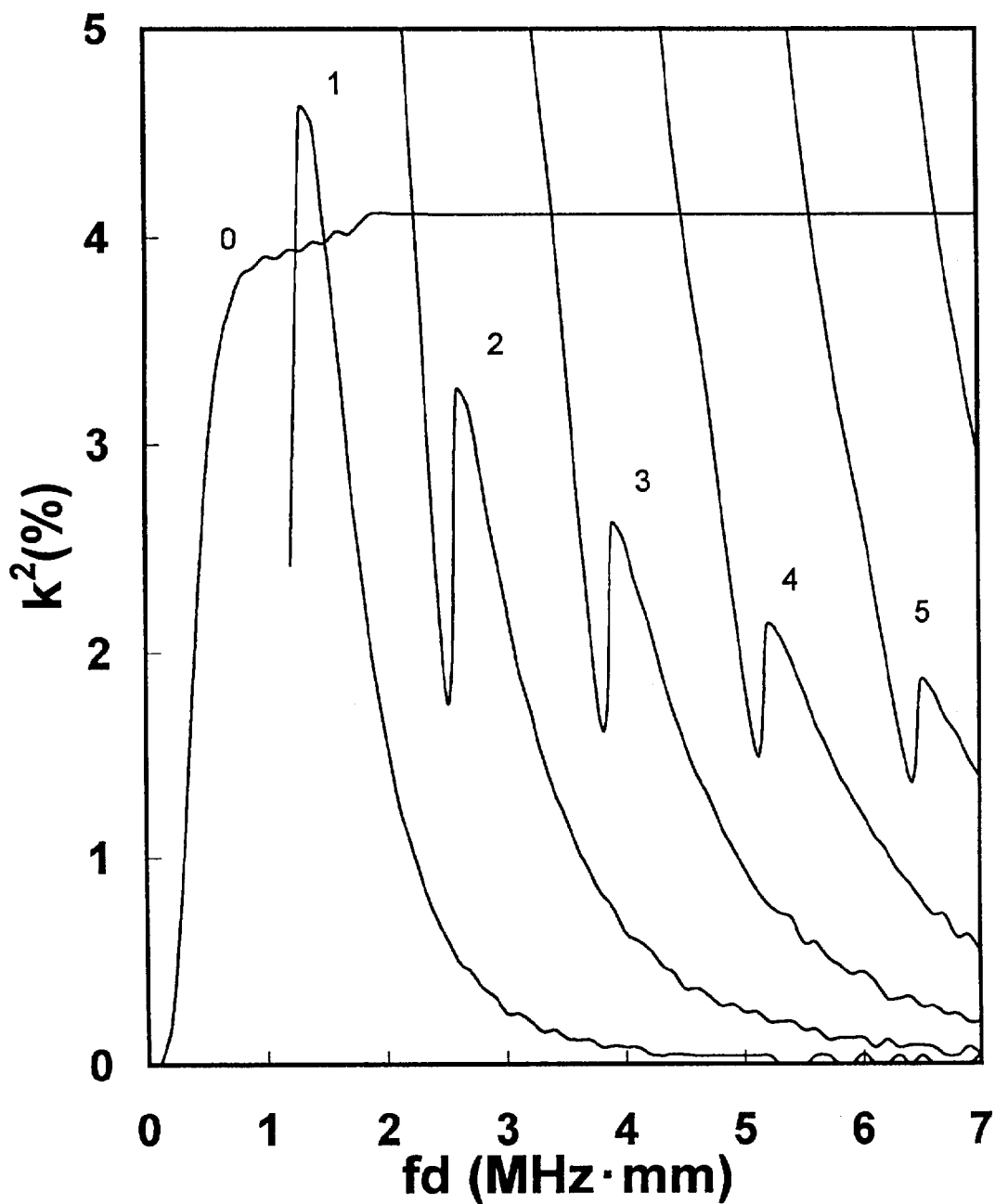
FIG. 3 shows a relationship between the electromechanical coupling constant $k^2$, and the product fd of the frequency f of the surface acoustic wave and the thickness d of piezoelectric substrate 3.

FIG. 3 shows a relationship between the electromechanical coupling constant $k^2$ calculated from the difference between the phase velocity under electrically opened condition and that under electrically shorted condition of piezoelectric substrate 3, and the product fd of the frequency f of the surface acoustic wave and the thickness d of piezoelectric substrate 3. In FIG. 3, nonpiezoelectric plate 4 is made from a glass having a shear wave velocity of 3091 m/s and a longitudinal wave velocity of 5593 m/s traveling on the glass alone. The velocities of 3091 m/s and 5593 m/s are about 1.3 times the velocities of a shear- and a longitudinal waves, 2450 m/s and 4390 m/s, respectively, in piezoelectric substrate 3 alone. An electric energy applied to interdigital transducer 1 is most easily transduced to the first mode surface acoustic wave when the fd value is approximately 1.3 MHz.mm, then the $k^2$ value is approximately 4.7% being the maximum value. It is clear that the $k^2$ value of 4.7% is worthy in comparison that a crystallized $LiNbO_3$ used as a popular piezoelectric body for exciting a surface acoustic wave generally has the $k^2$ value of approximately 5%.

Figure 4:
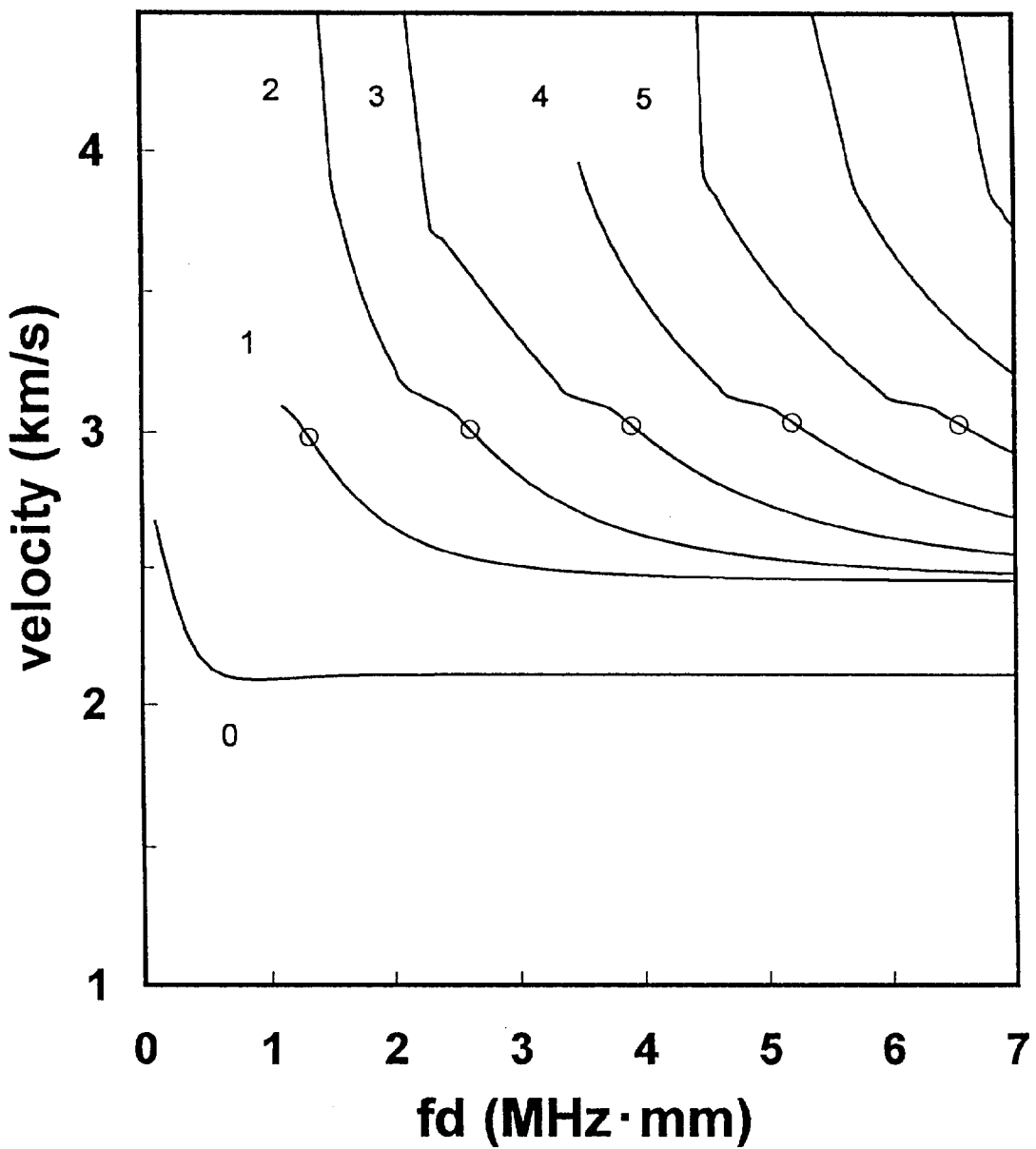
FIG. 4 shows a relationship between the phase velocity of the surface acoustic wave for each mode in piezoelectric substrate 3, and the fd value.

FIG. 4 shows a relationship between the phase velocity of the surface acoustic wave for each mode in piezoelectric substrate 3, and the fd value. In FIG. 4, nonpiezoelectric plate 4 is made from the same glass as FIG. 3. The fd value at each mark ○ has the maximum $k^2$ value where an electric energy applied to interdigital transducer 1 is most easily transduced to the surface acoustic wave, the maximum $k^2$ value being obtained from FIG. 3. The phase velocity of the surface acoustic wave of the first mode and the higher order modes at the mark ○ is approximately 2980 m/s, which is approximately equal to the phase velocity of the Rayleigh wave traveling on nonpiezoelectric plate 4 alone, the phase velocity of the Rayleigh wave being 2850 m/s.

Figure 5:
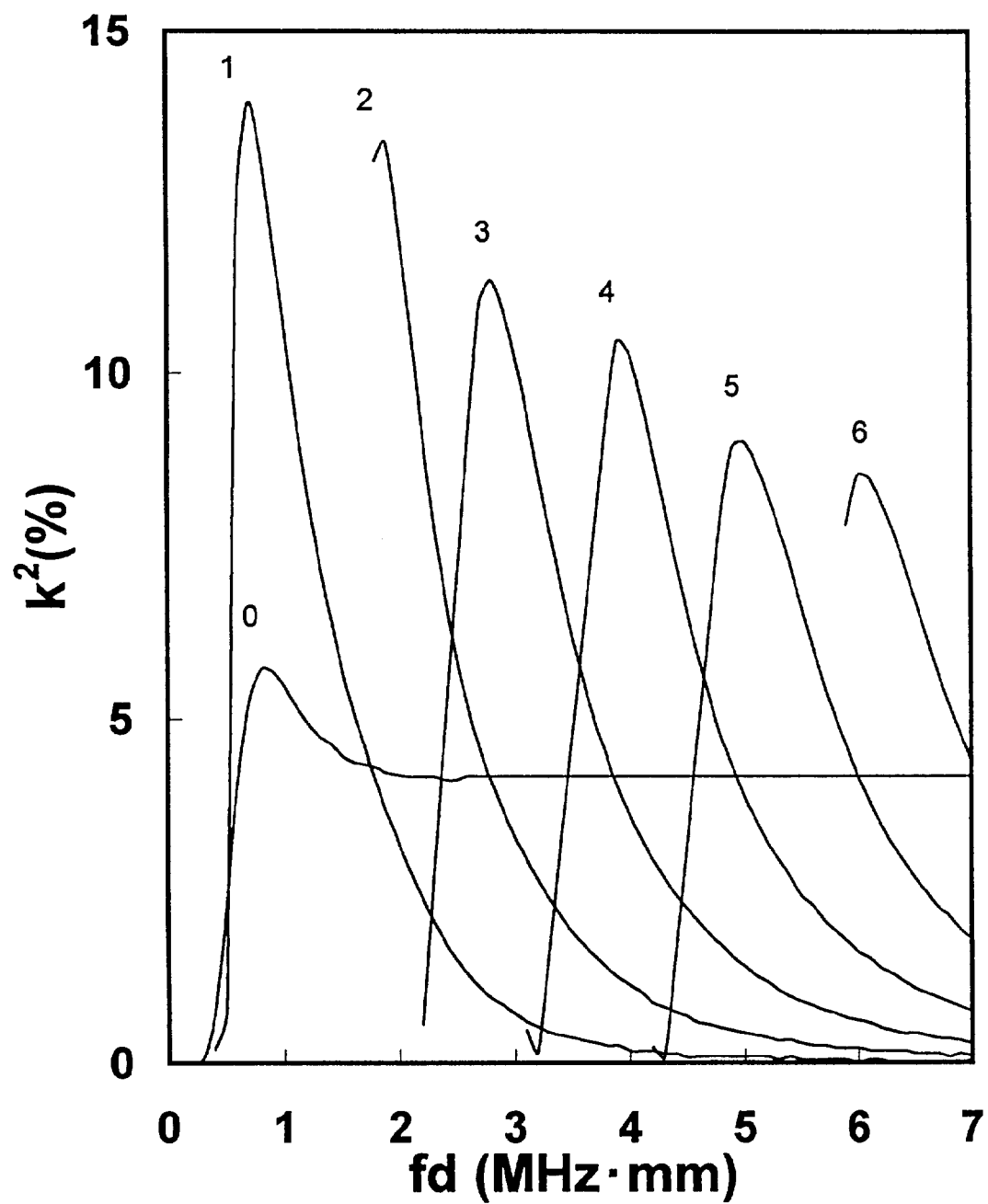
FIG. 5 shows a relationship between the $k^2$ value and the fd value.

FIG. 5 shows a relationship between the $k^2$ value and the fd value. In FIG. 5, nonpiezoelectric plate 4 is made from a glass having a shear wave velocity of 4203 m/s and a longitudinal wave velocity of 7604 m/s traveling on the glass alone. The velocities of 4203 m/s and 7604 m/s are about 1.7 times the velocities of a shear- and a longitudinal waves, 2450 m/s and 4390 m/s, respectively, in piezoelectric substrate 3 alone. An electric energy applied to interdigital transducer 1 is most easily transduced to the first mode surface acoustic wave when the fd value is approximately 0.7 MHz.mm, then the $k^2$ value is approximately 14.0% being the maximum value.

Figure 6:
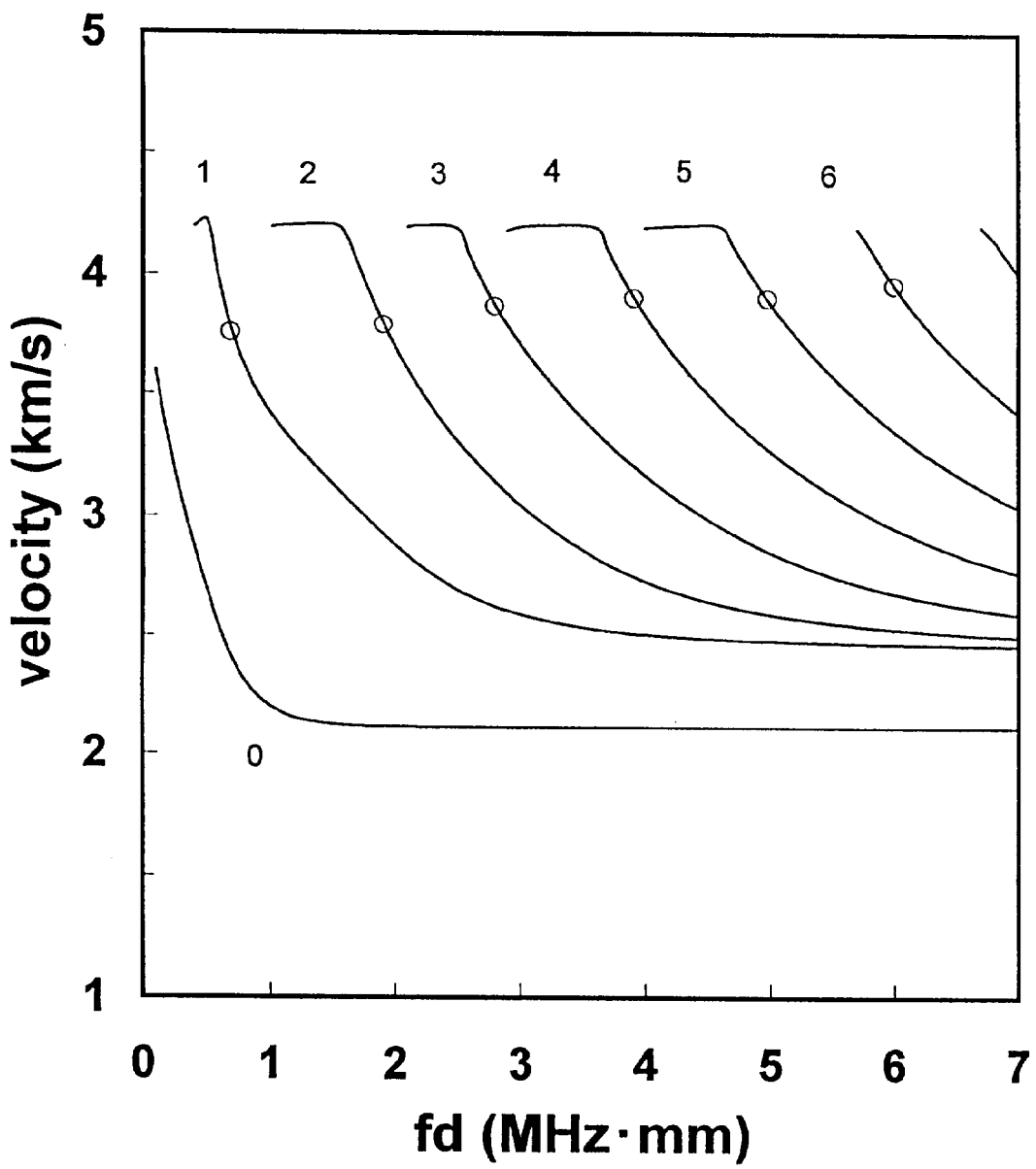
FIG. 6 shows a relationship between the phase velocity of the surface acoustic wave for each mode in piezoelectric substrate 3, and the fd value.

FIG. 6 shows a relationship between the phase velocity of the surface acoustic wave for each mode in piezoelectric substrate 3, and the fd value. In FIG. 6, nonpiezoelectric plate 4 is made from the same glass as FIG. 5. The fd value at each mark ○ has the maximum $k^2$ value where an electric energy applied to interdigital transducer 1 is most easily transduced to the surface acoustic wave, the maximum $k^2$ value being obtained from FIG. 5. The phase velocity of the surface acoustic wave of the first mode and the higher order modes at the mark ○ is approximately 3800 m/s, which is approximately equal to the phase velocity of the Rayleigh wave traveling on nonpiezoelectric plate 4 alone, the phase velocity of the Rayleigh wave being 3860 m/s.

It is clear from FIGS. 3~6 that an electric energy applied to interdigital transducer 1 is most easily transduced to the surface acoustic wave of the first mode and the higher order modes having the phase velocity approximately equal to the phase velocity of the Rayleigh wave traveling on nonpiezoelectric plate 4 alone. In the same way, the surface acoustic wave, of the first mode and the higher order modes, having the phase velocity approximately equal to the phase velocity of the Rayleigh wave traveling on nonpiezoelectric plate 4 alone, is most easily transduced to an electric signal at interdigital transducer 1.

Figure 7:
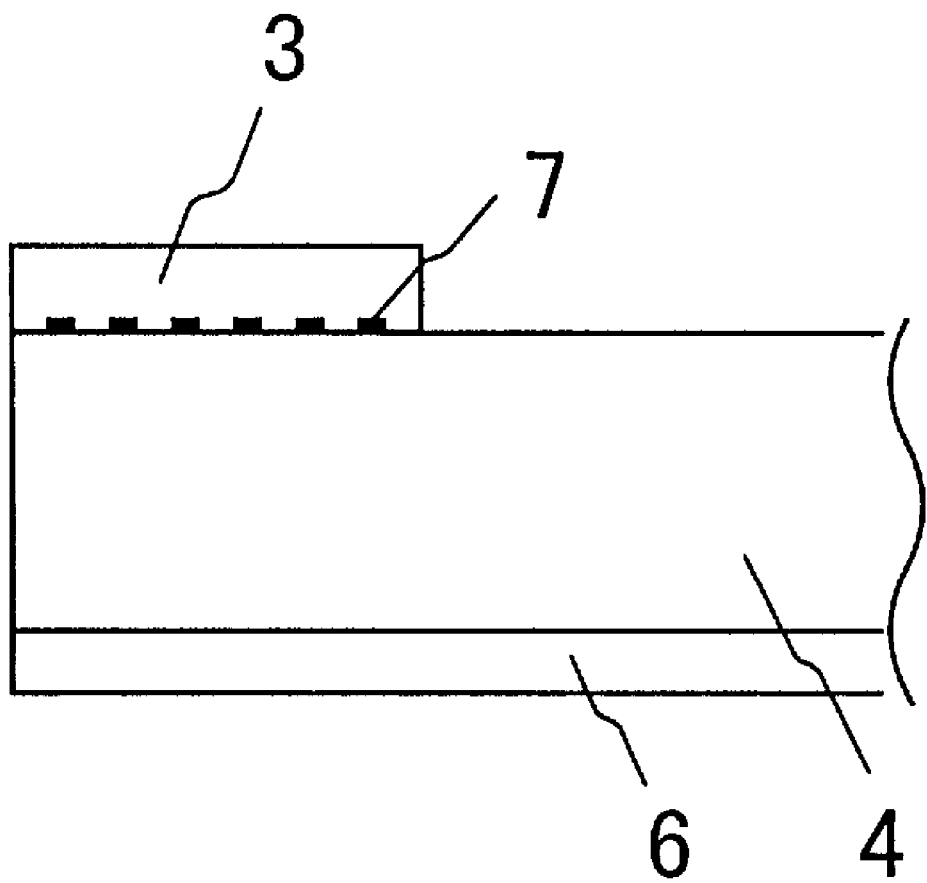
FIG. 7 shows a sectional view of a surface acoustic wave transducing device according to a second embodiment of the present invention.

FIG. 7 shows a sectional view of a surface acoustic wave transducing device according to a second embodiment of the present invention. The surface acoustic wave transducing device comprises interdigital transducer 7, piezoelectric substrate 3, nonpiezoelectric plate 4 and supporting board 6. Interdigital transducer 7, made from aluminium thin film, is mounted on the lower end surface of piezoelectric substrate 3, which is cemented on the upper end surface of nonpiezoelectric plate 4 through an epoxy resin with thickness of about 20 $\mu$m. The lower end surface of nonpiezoelectric plate 4 is cemented on supporting board 6.

Figure 8:
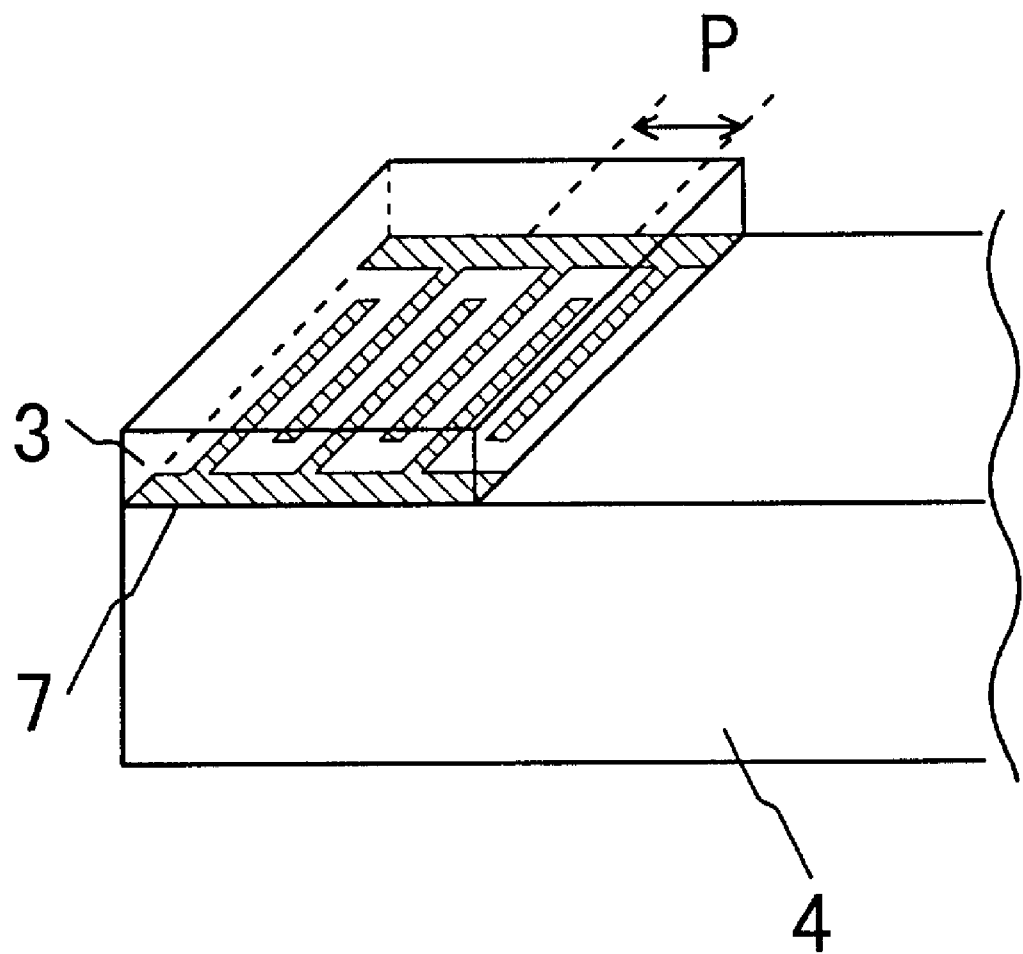
FIG. 8 shows a perspective view of the surface acoustic wave transducing device in FIG. 7.

FIG. 8 shows a perspective view of the surface acoustic wave transducing device in FIG. 7. Supporting board 6 is not drawn in FIG. 8. Interdigital transducer 7 has a regular-type construction consisting of ten finger pairs with an interdigital periodicity p of 460 $\mu$m. Interdigital transducer 7 has the same construction as interdigital transducer 1 in FIG. 2, except that interdigital transducer 1 has two kinds of distances between one electrode finger and two neighboring electrode fingers. Interdigital transducer 7 has an equal distance between two electrode fingers.

When operating the surface acoustic wave transducing device in FIG. 7 as an input device, an electric signal having a frequency approximately corresponding to the interdigital periodicity p of interdigital transducer 7 is applied to interdigital transducer 7. In this time, the surface acoustic wave, of the first mode and the higher order modes having the wavelength approximately equal to the interdigital periodicity p of interdigital transducer 7, is excited in piezoelectric substrate 3. The surface acoustic wave excited in piezoelectric substrate 3 is transmitted to the upper end surface of nonpiezoelectric plate 4.

When operating the surface acoustic wave transducing device in FIG. 7 as an output device, a surface acoustic wave, of the first mode and the higher order modes, transmitted from the upper end surface of nonpiezoelectric plate 4 to piezoelectric substrate 3, is transduced to an electric signal with a frequency approximately corresponding to the interdigital periodicity p of interdigital transducer 7, the surface acoustic wave having the wavelength approximately equal to the interdigital periodicity p. The electric signal is delivered at interdigital transducer 7. Though interdigital transducer 7 is mounted on the lower end surface of piezoelectric substrate 3, in other words, located between piezoelectric substrate 3 and nonpiezoelectric plate 4, interdigital transducer 7 is able to be located on the upper end surface of piezoelectric substrate 3. Thus, the surface acoustic wave transducing device in FIG. 7 has a small size which is very light in weight and has a simple structure.

Compared with the surface acoustic wave transducing device in FIG. 7, the surface acoustic wave transducing device in FIG. 1 can be operated under still lower power consumption owing to the excitation of the unidirectional surface acoustic wave. In addition, no reflection of a surface acoustic wave generates at the side surface of piezoelectric substrate 3 in FIG. 1 because of the excitation of the unidirectional surface acoustic wave. Therefore, the surface acoustic wave transducing device in FIG. 1 has little or no noise, so that has a still higher sensitivity.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A surface acoustic wave transducing device comprising:

a piezoelectric substrate having two end surfaces running perpendicular to the direction of the thickness d thereof;

an interdigital transducer formed on one end surface of said piezoelectric substrate, said interdigital transducer consisting of two electrodes $I_1$ and $I_2$ and having two kinds of distances between one electrode finger of said electrode $I_1$ and two neighboring electrode fingers of said electrode $I_2$;

an earth electrode formed on the other end surface of said piezoelectric substrate;

a phase shifter including at least a coil $L_1$, input terminals of said electrodes $I_1$ and $I_2$ being connected to said phase shifter in parallel; and a nonpiezoelectric plate having an upper- and a lower end surfaces running perpendicular to the thickness direction thereof, said piezoelectric substrate being mounted on said upper end surface of said nonpiezoelectric plate through said earth electrode, said thickness d of said piezoelectric substrate being smaller than an interdigital periodicity p of said interdigital transducer, the thickness of said nonpiezoelectric plate being larger than three times said interdigital periodicity p, said interdigital transducer and said earth electrode receiving an electric signal $E_1$ between said electrode $I_1$ and said earth electrode, and an electric signal $E_2$ between said electrode $I_2$ and said earth electrode via said phase shifter, exciting a surface acoustic wave of the first mode and the higher order modes in said piezoelectric substrate, and transmitting said surface acoustic wave having the wavelength approximately equal to said interdigital periodicity p to said upper end surface of said nonpiezoelectric plate, the phase velocity of said surface acoustic wave of said first mode and said higher order modes being approximately equal to the phase velocity of the Rayleigh wave traveling on said nonpiezoelectric plate alone, each of said electric signals $E_1$ and $E_2$ having a frequency approximately corresponding to said interdigital periodicity p, the phase difference between said electric signals $E_1$ and $E_2$ being 2 $\pi$y, said nonpiezoelectric plate being made of a material such that the phase velocity of the surface acoustic wave traveling on said nonpiezoelectric plate alone is higher than that traveling on said piezoelectric substrate alone.

2. A surface acoustic wave transducing device as defined in claim 1, wherein x<½ in a shorter distance xp of said two kinds of distances between one electrode finger of said electrode $I_1$ and two neighboring electrode fingers of said electrode $I_2$, and x+y=±½ in said phase difference 2 $\pi$y between said electric signals $E_1$ and $E_2$.

3. A surface acoustic wave transducing device as defined in claim 1 further comprising a supporting board cemented to said lower end surface of said nonpiezoelectric plate.

4. A surface acoustic wave transducing device as defined in claim 1, wherein said piezoelectric substrate is made of a piezoelectric ceramic, the polarization axis thereof being parallel to the thickness direction thereof.

5. A surface acoustic wave transducing device comprising:
- a piezoelectric substrate having two end surfaces running perpendicular to the direction of the thickness d thereof, said piezoelectric substrate being made of a piezoelectric polymer;
- an interdigital transducer formed on one end surface of said piezoelectric substrate, said interdigital transducer consisting of two electrodes $I_1$ and $I_2$ and having two kinds of distances between one electrode finger of said electrode $I_1$ and two neighboring electrode fingers of said electrode $I_2$;
- an earth electrode formed on the other end surface of said piezoelectric substrate;
- a phase shifter including at least a coil $L_1$, input terminals of said electrodes $I_1$ and $I_2$ being connected to said phase shifter in parallel; and
- a nonpiezoelectric plate having an upper- and a lower end surfaces running perpendicular to the thickness direction thereof, said piezoelectric substrate being mounted on said upper end surface of said nonpiezoelectric plate through said earth electrode, said thickness d of said piezoelectric substrate being smaller than an interdigital periodicity p of said interdigital transducer, the thickness of said nonpiezoelectric plate being larger than three times said interdigital periodicity p, and x<½ in a shorter distance xp of said two kinds of distances between one electrode finger of said electrode $I_1$ and two neighboring electrode fingers of said electrode $I_2$,
- said interdigital transducer and said earth electrode receiving an electric signal $E_1$ between said electrode $I_1$ and said earth electrode, and an electric signal $E_2$ between said electrode $I_2$ and said earth electrode via said phase shifter, exciting a surface acoustic wave of the first mode and the higher order modes in said piezoelectric substrate, and transmitting said surface acoustic wave having the wavelength approximately equal to said interdigital periodicity p to said upper end surface of said nonpiezoelectric plate, the phase velocity of said surface acoustic wave of said first mode and said higher order modes being approximately equal to the phase velocity of the Rayleigh wave traveling on said nonpiezoelectric plate alone, each of said electric signals $E_1$ and $E_2$ having a frequency approximately corresponding to said interdigital periodicity p, the phase difference between said electric signals $E_1$ and $E_2$ being 2 πy, and x+y=±½ in said phase difference 2 πy,
- said nonpiezoelectric plate being made of a material such that the phase velocity of the surface acoustic wave traveling on said nonpiezoelectric plate alone is higher than that traveling on said piezoelectric substrate alone.

* * * * *